(12) United States Patent
Chang et al.

(10) Patent No.: US 8,407,647 B2
(45) Date of Patent: Mar. 26, 2013

(54) SYSTEMS AND METHODS FOR DESIGNING AND MAKING INTEGRATED CIRCUITS WITH CONSIDERATION OF WIRING DEMAND RATIO

(75) Inventors: Fong-Yuan Chang, Er-Chong Li (TW); Sheng-Hsiung Chen, Hsinchu (TW); Tung-Chieh Chen, Taipei (TW); Ren-Song Tsay, Chu-Pei (TW); Wai-Kei Mak, Hsinchu (TW)

(73) Assignees: Springsoft, Inc., Hsinchu (TW); Springsoft USA, Inc., San Jose, CA (US)

( * ) Notice: Subject to any disclaimer, the term of this patent is extended or adjusted under 35 U.S.C. 154(b) by 78 days.

(21) Appl. No.: 12/970,888

(22) Filed: Dec. 16, 2010

(65) Prior Publication Data

US 2011/0154282 A1 Jun. 23, 2011

Related U.S. Application Data

(60) Provisional application No. 61/287,344, filed on Dec. 17, 2009.

(51) Int. Cl.
*G06F 17/50* (2006.01)
(52) U.S. Cl. .......................... 716/126; 716/130; 716/131
(58) Field of Classification Search .......... 716/118–119, 716/122–126, 129–131
See application file for complete search history.

(56) References Cited

U.S. PATENT DOCUMENTS

| 5,629,860 | A * | 5/1997 | Jones et al. | 716/113 |
| 6,536,028 | B1 * | 3/2003 | Katsioulas et al. | 716/125 |
| 6,618,846 | B2 * | 9/2003 | Cheng | 716/115 |
| 6,668,365 | B2 * | 12/2003 | Harn | 716/123 |
| 2003/0051217 | A1 * | 3/2003 | Cheng | 716/5 |
| 2003/0182649 | A1 * | 9/2003 | Harn | 716/11 |
| 2006/0190889 | A1 * | 8/2006 | Cong et al. | 716/8 |
| 2010/0205570 | A1 * | 8/2010 | Chapman | 716/3 |

OTHER PUBLICATIONS

Fathi, B., et al., "A Pre-Placement Net Length Estimation Technique for Mixed-Size Circuits," SLIP '09. ACM, pp. 45-52, Jul. 2009.
Balachandran, S., et al., "A-Priori Wirelength and Interconnect Estimation Based on Circuit Characteristics," SLIP '03, ACM, pp. 77-84, Apr. 2003.

* cited by examiner

*Primary Examiner* — Stacy Whitmore
(74) *Attorney, Agent, or Firm* — Ardeshir Tabibi; Kilpatrick Townsend & Stockton LLP

(57) ABSTRACT

A method for designing and making an integrated circuit is described. That method utilizes statistical models of wire segments to accurately estimate the expected length of minimum-length, orthogonal wire segments within a block. From these estimates, the method accurately estimates an ratio between the horizontal and vertical routing resources required, termed the "H/V Demand Ratio." From the H/V Demand Ratio, an accurate estimate of the height and width of the block may be determined. Thereafter, placement and routing may be performed quickly and accurately, thereby allowing the block to be designed and manufactured quickly and cost effectively. A method for designing an integrated circuit with efficient metal-1 resource utilization is also described.

12 Claims, 13 Drawing Sheets

SYSTEMS AND METHODS FOR DESIGNING AND MAKING INTEGRATED CIRCUITS WITH CONSIDERATION OF WIRING DEMAND RATIO

RELATED APPLICATIONS

This application claims priority to provisional application 61/287,344, filed Dec. 17, 2009.

BACKGROUND

1. Field of the Invention

The present disclosure is directed to the field of integrated circuit design and more particularly to designing or making an integrated circuit design block based at least in part on an H/V demand ratio for that design block.

2. Description of Related Art

Time-to-market and manufacturing cost may be key factors in the success of modern electronic products, such as digital cameras, video disc players, and personal computers. Short time-to-market may allow an electronic product to be responsive to consumer desires and market trends, thus tending to improve the market success of the electronic product. Low manufacturing cost may allow a product manufacturer to reduce a product's selling price while maintaining a reasonable profit margin on each unit sold.

The time-to-market and manufacturing cost of an electronic product may be heavily influenced by the development time and manufacturing cost of individual components in the electronic product. Integrated circuits ("ICs") are common components in modern electronic products, and ICs are known to involve substantial development time and manufacturing cost. Thus, keeping the development time and manufacturing cost of ICs low may be beneficial to the market success of an electronic product incorporating such ICs.

Prior to the present invention, substantial inefficiencies in the IC design process led to long development times and high manufacturing costs for ICs. Although synthesis, coupled with cell placement and routing, offers development time and cost benefits relative to non-synthesized designs, many ICs incorporating synthesis in their design process may fail to realize their full potential for fast time-to-market or low manufacturing cost because existing software tools for synthesizing blocks are unable to accurately estimate the wiring demands for connecting logic gates within a block. As a result, design engineers are often forced to manually estimate the area needed for internal wiring.

These manual internal wiring estimates take considerable engineering effort and often lead to under-estimation or over-estimation of the area needed for wiring. Over-estimation of wiring area may lead to ICs that are uneconomical to manufacture or ICs that require time-consuming design iterations to become economical to manufacture, thereby increasing time-to-market. Under-estimation of wiring area may lead to ICs that cannot be synthesized because inadequate internal wiring resources are available to establish necessary connections between logic gates. As a result, time-consuming design iterations are needed, thereby increasing time-to-market for the IC. Under-utilization of available wiring resources also resulted from cell placement techniques prior to the present invention, leading to higher manufacturing cost for the IC.

Accordingly, there is a need for methods of designing and making ICs in a way that accurately considers wiring demands and efficiently utilizes available wiring resources, thereby allowing ICs to achieve fast time-to-market and low manufacturing cost.

SUMMARY

In accordance with some embodiments, a system and method for designing a circuit device is disclosed. In the method, a block of circuitry in the circuit device is identified. An initial aspect ratio for the block of circuitry is also identified, where the initial aspect ratio of the block of circuitry is reflective of a ratio of a dimension of the block along a first direction and along a second direction. A demand ratio for the block is also evaluated, where the demand ratio is reflective of a ratio of a conductive wiring demand along the first direction and a conductive wiring demand along the second direction. Additionally, routing resources for routing the circuitry in the first direction within the block as well as routing resources for routing the circuitry in the second direction within the block are evaluated. Thereafter, a minimum number of wires needed for an available routing layer are determined, based at least on the available routing resources. Further, a desired dimension for the block along at least one of the first direction and the second direction is derived, based at least in part on the number of wires needed. A suggested size of the block may be derived, based at least in part on the desired dimension for the block along at least one of the first direction and the second direction and the initial aspect ratio for the block.

DETAILED DESCRIPTION

Figure 1A:
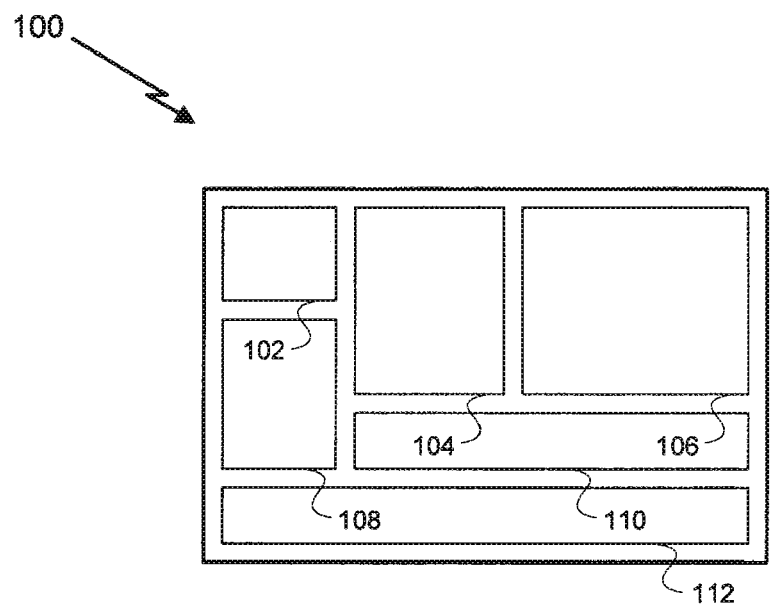
FIG. 1A illustrates an exemplary IC that has been partitioned into a plurality of design blocks.

Embodiments consistent with the principles of the present invention include methods and systems for designing and making ICs while more accurately considering wiring resources needed within design blocks, thereby permitting faster time-to-market and lower manufacturing costs for ICs than provided for by prior art systems.

The methods and systems described herein utilize a novel approach to estimate the wiring resources needed within a design block in an IC prior to "placing" and "routing" that block. This novel approach uses "H/V Demand Ratio" to determine the wiring resources required in each of the horizontal and vertical dimensions, and then selecting the height and width of the block based on those required wiring resources. Unlike prior art industry practice, this novel approach may simultaneously balance design time and block size to determine a block size that is neither too large nor too small. Moreover, this balanced block size may be achieved much quicker than prior art block design methods. Thus, designing and making ICs using the H/V Demand Ratio may bring substantial benefits in the form of cost savings and time-to-market to IC designers that were not previously available.

The discussion that follows proceeds in two major sections. First, a method for designing and making a block is discussed, including application of the HN Design Ratio to designing a block. Second, a method for determining the HN Design Ratio" for a block is discussed. These discussions articulate the method and its advantages relative to current IC design practices.

Method for Designing and Making a Block

The design process for an IC generally has two stages. First, a designer determines what functions the IC will perform (e.g., video graphics acceleration, data encryption, or network communications) and writes HDL (Hardware Description Language, e.g., Verilog or VHDL) code to implement those functions; this stage of the design process is often referred to as "logic design" of the IC. Second, a designer determines how the logic set forth during logic design will be implemented in silicon; this stage of the design process is often referred to as "physical design" of the IC. Upon completion of the physical design of an IC, a computer database containing information about the physical design is sent to a manufacturing facility where that information is used to create tooling for manufacturing ICs based on the completed physical design.

Logic design of an IC typically involves partitioning the logical functions to be performed by the IC into "blocks" and then writing HDL code for each block that implements the functions that block will perform. For example, an IC that performs video graphics acceleration may be partitioned into blocks that perform each of the following functions: reading graphics data from main memory; performing operations on pixels representing the graphics data; and generating a digital or analog video signal for transmission to a video monitor.

Partitioning logical functions into blocks serves two purposes. First, logical functions relating to a common purpose may be grouped together for ease of design. Second, partitioning an entire IC into a series of smaller blocks may allow the physical design of the individual blocks to be more manageable than performing physical design on the whole IC as a single block.

FIG. 1A illustrates an exemplary IC 100 that has been partitioned into a plurality of design blocks. As shown, IC 100 comprises design blocks 102, 104, 106, 108, 110, and 112. Design block 112, also shown in FIG. 1B, has a width that is greater than its height. The ratio of a block's width to the block's height is commonly referred to as the block's "aspect ratio" (AR). Thus, design block 112 has an aspect ratio that is greater than one—a common situation in IC design. The significance of a block's aspect ratio will be discussed in more detail in conjunction with the physical design stage of the IC design process.

Figure 1B:
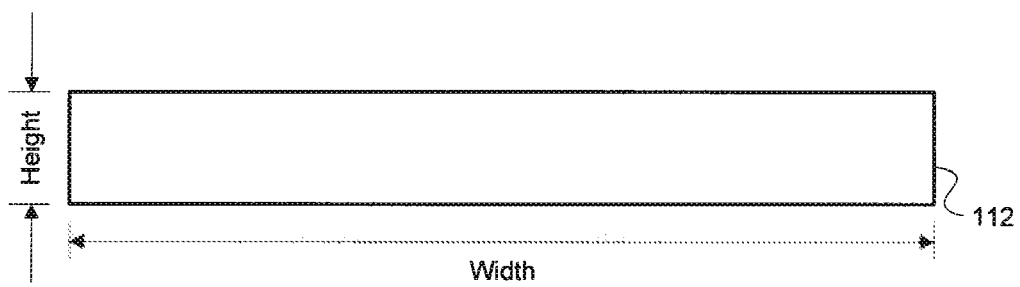
FIG. 1B illustrates an exemplary block with a width and height.

For simplicity, the discussion that follows assumes blocks have aspect ratios greater than one (as shown in FIG. 1B). Blocks whose heights are greater than their widths (i.e., blocks whose aspect ratio is less than one), however, may still utilize the discussion that follows if such blocks are rotated ninety degrees prior to analysis.

After partitioning the logical functions to be performed into blocks, the designer writes HDL code for each block that implement the functions that block will perform. The HDL code for each block represents a starting point for the physical design of that block, as discussed below.

Physical design of a block typically involves translating the HDL code for that block into logic gates and wires that may be manufactured on silicon. The physical design of a block is typically a three-step process. First, the HDL code developed during logical design of the block is translated into a series of discrete, interconnected logic gates (with corresponding physical cells) during a step called "synthesis." Second, a physical location within the block is determined for each physical cell during a step called "placement." Finally, electrical coupling between physical cells is established during a step called "routing." Each of these steps is described further in the discussion that follows.

Synthesis involves translating HDL code for a block into a collection of discrete, interconnected logic gates that will collectively perform the functions specified in the HDL code. For example, the HDL code for a block may include a recitation of a 32-bit adder function. Synthesis of this block may translate the recitation of the 32-bit adder function into dozens or possibly hundreds of discrete logic gates, such as NAND gates and NOR gates. Synthesis also determines how to interconnect the various discrete logic gates so that these logic gates collectively perform the recited function. This translation process is typically performed in an automated manner by computer software, but some of the translation process could be performed by a designer.

Each discrete logic gate selected during synthesis has a corresponding "physical cell" in a cell library. This physical cell represents a collection of interconnected transistors that electrically perform the logical function of the corresponding logic gate. These interconnected transistors represent the form of the logic gate that may be eventually manufactured on silicon. For example, a 32-bit adder included within the functional description of a block may be synthesized into a large number of gates including one or more NAND2 gates. The physical cell for the NAND2 gate may be composed of four transistors that are interconnected (internal to the physical cell) such that the physical cell electrically performs a NAND2 function once the cell is manufactured. Thus, synthesis involves translating the HDL code for a block into a collection of discrete, interconnected logic gates, such that each logic gate has a corresponding physical cell. Collectively, the interconnected physical cells electrically perform the logical functions specified by the HDL code for the block when the physical cells are manufactured in silicon. Prior to manufacturing, however, these physical cells go through physical design steps of "placement" and "routing."

Placement, the second step in physical design of a block, involves identifying a location for each physical cell within the perimeter of the physical area of that block. Many software programs and designers that perform placement attempt to advantageously place physical cells near each other if those physical cells will be coupled during the routing step of physical design. The couplings to be established during the routing step correspond to the interconnections between logic gates that were determined during synthesis.

Figure 2:
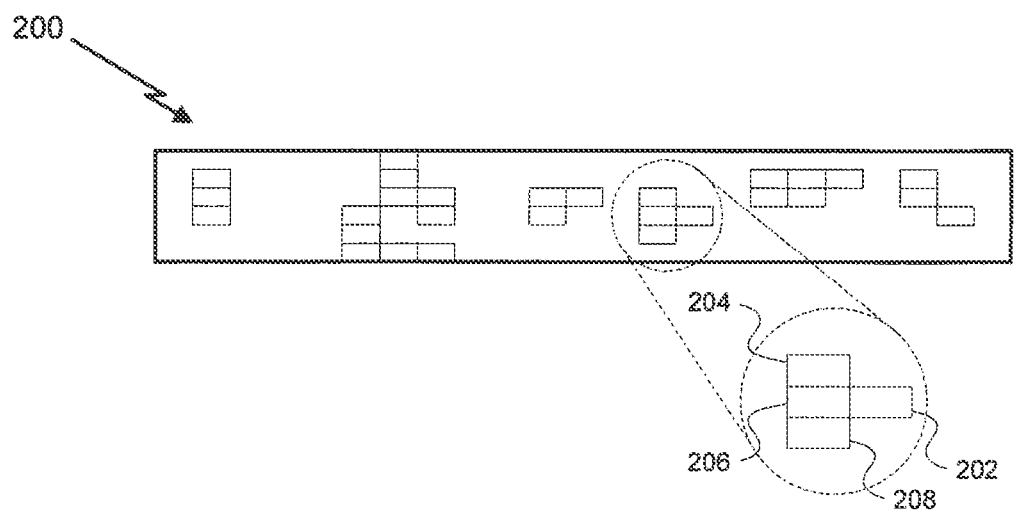
FIG. 2 illustrates an exemplary block that comprises a plurality of physical cells placed within the perimeter of that block.

FIG. 2 illustrates an exemplary block 200 that comprises a plurality of physical cells placed within the perimeter of that block. As shown, the block 200 comprises physical cells 202, 204, 206, and 208. Block 200 also comprises a plurality of other physical cells that have not been labeled for the sake of clarity. As shown in FIG. 2, physical cells may be advantageously placed near other physical cells they will be coupled to during the routing step. For example, physical cells 202, 204, 206, and 208 might be discrete, interconnected logic gates generated during synthesis of the block.

Routing, the third step in physical design of a block, involves electronically coupling inputs and outputs of physical cells in a manner that corresponds to the interconnections between logic gates determined during synthesis. Routing a single net that couples a single output of a first physical cell with a single input of a second physical cell involves determining a routing "path" from the output "pin" of the first physical cell to the input pin of the second physical cell and reserving the physical area occupied by that path on a particular metal routing layer.

Figure 3A:
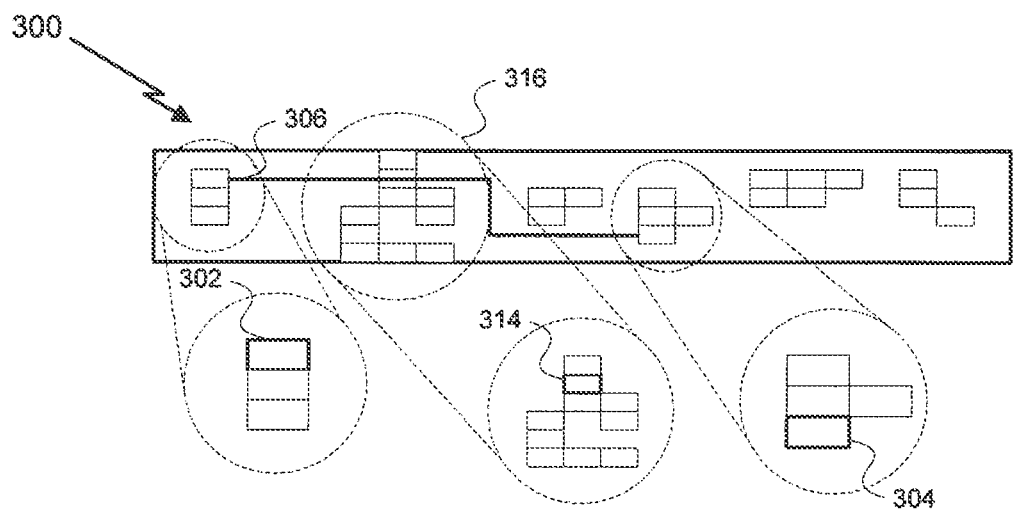
FIG. 3A illustrates an exemplary block that comprises a first cell whose output is coupled to the input of a second cell through a routed net.
Figure 3B:
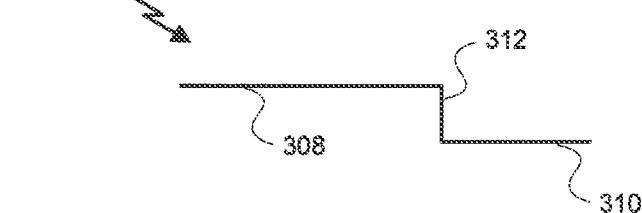
FIG. 3B illustrates an exemplary first horizontal path segment, second horizontal path segment, and vertical path segment.

FIG. 3A illustrates an exemplary block 300 that comprises a first cell 302 whose output is coupled to the input of a second cell 304 through a routed net 306. Routed net 306 may traverse (i.e., route over) cell 314 if the available routing resources in the metal layers directly above cell 314 allow the routed net to pass over that cell. As shown in FIG. 3A, the process of routing nets typically involves determining routing paths between output pins and input pins utilizing horizontal and vertical wire path segments. For example, routed net 306, shown in greater detail in FIG. 3B, comprises a first horizontal path segment 308, a second horizontal path segment 310, and a vertical path segment 312. Additionally, horizontal path segments 308 and 310 may be present in a first metal layer and vertical path segment 312 may be present in a second metal layer.

Routing nets in a block utilizing horizontal and vertical path segments (i.e., "orthogonal" path segments) on different metal layers rather than non-orthogonal wiring segments within a single metal layer tends to promote efficient use of available routing resources. Efficient resource utilization within a metal layer may be realized when wire segments within the metal layer are parallel and oriented in a single direction (i.e., either oriented horizontally or vertically). To achieve this efficiency, "routing channels" may be established within a metal layer.

A routing channel represents a portion of a metal layer whose space is reserved for routing a plurality of wires between gates that are not in close proximity to each other. Such routes are often referred to as "global routes," in contrast to routes between gates that are in close proximity that are often referred to as "local routes." For example, route 306 may be considered a global route because cell 302 and cell 304 are not in close proximity. By contrast, a route (not shown) coupling cell 204 with cell 202, cell 206, or cell 208 in FIG. 2 may be considered a local route.

In the prior art, a first metal layer, comprising the metal layer nearest to the silicon in the IC (i.e., "metal-1"), was typically reserved for local routing while additional layers above metal-1 (e.g., a second metal layer [metal-2], a third metal layer [metal-3], etc.) were reserved for global routing. When an entire metal layer is reserved for a routing channel, the length of the routing channel (i.e., the dimension of the routing channel that is aligned with the direction of the wires within routing channel) is the full height or full width of the block, depending on the orientation of wire segments within that layer.

Reserving the first metal layer for local routing rather than global routing can lead to substantially inefficient use of available routing resources. Although local routes are typically short in length, as discussed above, local routes have the unfortunate property that they consume scarce wiring resources at a particular location, potentially preventing global routing through that location. For example, route 306 is shown as traversing cell 314. Although FIG. 3A does not illustrate all local and global routing between cells in block 300 (for clarity purposes), we may assume that each cell has at least one input and one output that are each coupled to other cells through a local route or global route. Since wiring resources within a given area are limited, areas with clustered cells (such as cell group 316) may have most or all of their available wiring resources consumed by local routing rather than global routing. If all routing resources within the region near cell group 316 were consumed by local routing in the example of FIG. 3A, routing between cells 302 and 304 would not be possible without adding an additional metal layer (which has cost and reliability implications, as discussed below). Thus, designs are motivated to use wiring resources efficiently. Routing channels are one means for doing so.

Figure 4A:
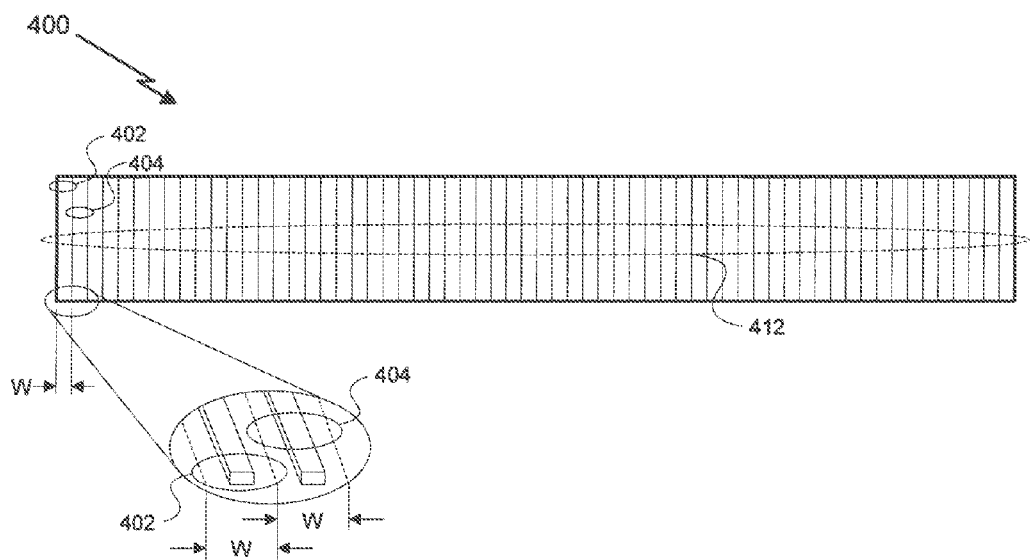
FIG. 4A illustrates an exemplary metal layer comprising a vertical routing channel composed of a plurality of vertical routing tracks.

FIG. 4A illustrates an exemplary metal layer 400 comprising a vertical routing channel 412 composed of a plurality of parallel routing tracks. As shown in FIG. 4A, the vertical routing channel 412 includes routing tracks 402 and 404. As shown in FIG. 4A, each routing track has width W. The perspective view portion of FIG. 4A illustrates that a routing channel may be comprised of a plurality of adjacent routing tracks. The perspective view of FIG. 4A also illustrates that each routing track in the routing channel, including routing tracks 402 and 404, may be comprised of a conductive wire whose width allows for at least a minimum-required spacing to a wire in an adjacent wiring track. FIG. 4A as a whole illustrates that adjacent routing tracks within a routing channel may be continuous across the metal layer 400. The width of each wire in a metal layer and the spacing between wires in that metal layer are typically provided by the IC manufacturing foundry that will manufacture the finished design of the IC.

Figure 4B:
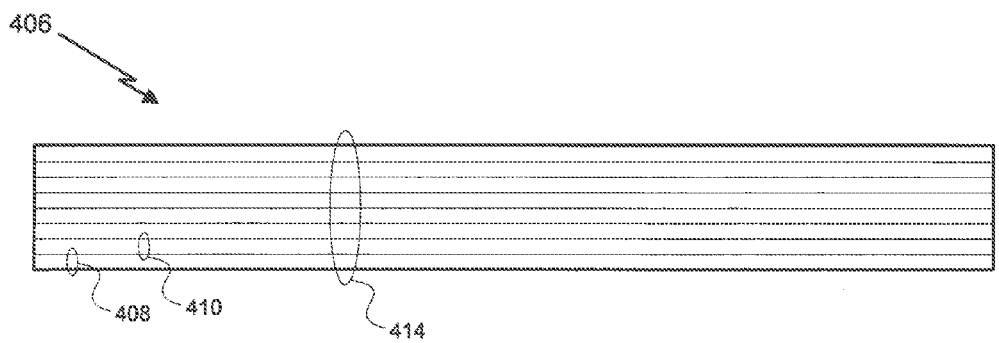
FIG. 4B illustrates an exemplary metal layer comprising a horizontal routing channel composed of a plurality of horizontal routing tracks.

FIG. 4B illustrates an exemplary metal layer 406 comprising a horizontal routing channel 414 composed of a plurality of horizontal routing tracks. As shown, horizontal routing channel 414 includes routing tracks 408 and 410. In one embodiment, each routing track in the horizontal routing channel also has width W. Each routing track may be comprised of a conductive wire whose width allows for at least a minimum-required spacing to a wire in an adjacent wiring channel.

In one embodiment, metal layers 400 and 406 comprise routing channels composed of a continuous series of adjacent routing tracks. The routing tracks in metal layers 400 and 406 may also be of consistent width (W) and consistent spacing between adjacent routes. This configuration may lead to efficient use of routing resources. In other embodiments, however, metal layers 400 and 406 could be comprised of routing tracks that are neither adjacent nor continuous, as well as routing tracks that are not of consistent width and routes that are not consistently spaced. Other embodiments could also include routing channels with consistent track width and route spacing within a single metal layer but with different routing track width and route spacing in each metal layer.

In one embodiment, adjacent metal layers may alternate between being comprised of horizontal and vertical routing channels (i.e., adjacent layers are orthogonal). This configuration may apply to most or all of the metal layers available for routing use within the block. Other embodiments may include adjacent layers that do not alternate between horizontal and vertical routing channels with every layer.

Although the above-described routing channel configuration may offer convenient routability for individual routes, this configuration may also lead to underestimating the routing resources needed in the horizontal dimension. In this routing channel configuration, for blocks with large aspect ratios, many (short) routing tracks are available in the vertical dimension but relatively few (long) routing channels are available in the horizontal dimension. Thus, a relatively small number of horizontal routes may consume most or all of the available horizontal routing resources through a congested portion of the block.

Prior art software tools and design heuristics often fail to accurately estimate how many horizontal routing resources are needed to route a block. As a result, designers are often forced to either start with a small block height and iterate placement and routing until the block can be routed properly, which has substantial time-to-market disadvantages, or start with a large block height so the block will be certain to route properly. Unfortunately, starting with a large block height may result in a block that is larger than necessary, which may have substantial manufacturing cost disadvantages. Fortunately, the "H/V demand ratio" addresses these problems by providing a more accurate estimate of routing resources needed to route the design.

The H/V Demand Ratio for a block represents a ratio between an estimated horizontal routing resource demand for the block and an estimated vertical routing resource demand for the block. As discussed below, the H/V Demand Ratio is based on advanced statistical models of routed nets. Once the H/V Demand Ratio is known for a block, an accurate estimate of the horizontal routing resources utilized by a block may be determined in conjunction with an estimate of the total routing resources utilized by a block. From the estimate of horizontal routing resources utilized by a block, the height of the block may be estimated. From the estimated block height and the aspect ratio of the block, the width of the block may be estimated. This block height and width represents an estimated block size that may allow the block to be placed and routed with less iteration than blocks whose size was estimated with existing methods. From the estimated block height and block width, as well as the cell area required to place all cells in the design, the cells within the design may also be organized to allow one or more routing channels in metal-1, thereby decreasing wiring demands on other routing layers.

Based on these steps, the block height and block width determined using the H/V Demand Ratio may be substantially smaller than blocks whose size was estimated with existing methods. Thus, the H/V Demand Ratio may allow a block to be designed and made with improved time-to-market and reduced manufacturing cost.

H/V Demand Ratio Estimation

As discussed above, the H/V Demand Ratio represents a ratio between the estimated horizontal routing resources utilized by a block and the estimated vertical routing resources utilized by the block. Estimated horizontal and vertical route resource utilization is determined from probabilistic estimates of routed net length combined with design parameters determined from practical experience or academic research. The H/V Demand Ratio for a block ($R_{h/v}$) may be determined by creating weighted estimates of the H/V Demand Ratio for routed nets comprising specific numbers of pins and then summing those weighted estimates across routed nets with all numbers of pins. This determination is a function of $R_n$, which represents the H/V Demand Ratio for a routed net comprising n pins, and $W_n$, which represents the ratio of the total length of routed nets with n pins to the total net length of all routed nets in the block. The value of $R_n$ may be determined for each legitimate value of n as discussed below. The value of $W_n$ may be determined for each legitimate value of n by utilizing net wirelength models or statistical values from real designs. Those skilled in the art will recognize that $R_{h/v}$ may also be expressed as equations (1) and (2) below.

$$R_h = \sum_{n=2}^{\infty} W_n \cdot \frac{R_n}{1 + R_n} \tag{1}$$

$$R_{\frac{h}{v}} = \frac{R_h}{1 - R_h} \tag{2}$$

As shown above, routed nets may comprise two or more pins per net (i.e., n may range in value from two to infinity). A routed net comprising two pins may couple a single output of a first cell to a single input to a second cell. Although equation (1) suggests that a routed net could theoretically comprise an infinite number of pins, practical experience has shown that more than ninety percent of routed nets comprise twenty-or-fewer pins, and virtually all routed nets comprise thirty-or-fewer pins. Thus, a practical implementation of equation (1) may sum weighted estimates of $R_n$ across a finite range of pin numbers, where the upper bound of that finite range may be determined by the degree of computational accuracy desired. Of course, embodiments consistent with the present invention may be implemented with a much larger number of pins as well.

$R_n$ may be determined for each value of n by determining expected horizontal and vertical routed net lengths from statistical models of wire segments. For nets comprising two and three pins, important properties of routed nets comprising two or three pins allow for a straightforward approach to estimating the length for such routed nets. Therefore, the discussion to follow begins with an estimation of length for routed nets comprising two or three pins. Thereafter, the principles discussed with regard to routed nets comprising two and three pins are extended to cover routed nets comprising greater than three pins. Discussion of expected routed net length for nets comprising two and three pins begins with an introduction to several important terms and concepts.

Expected Routed Net Length for Nets Comprising Two/Three Pins

Figure 5A:
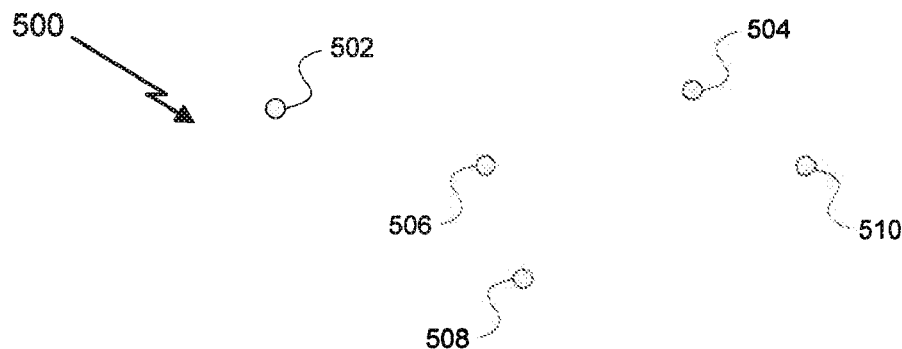
FIG. 5A illustrates an exemplary collection of five pins that may be coupled to form a routed net.
Figure 5B:
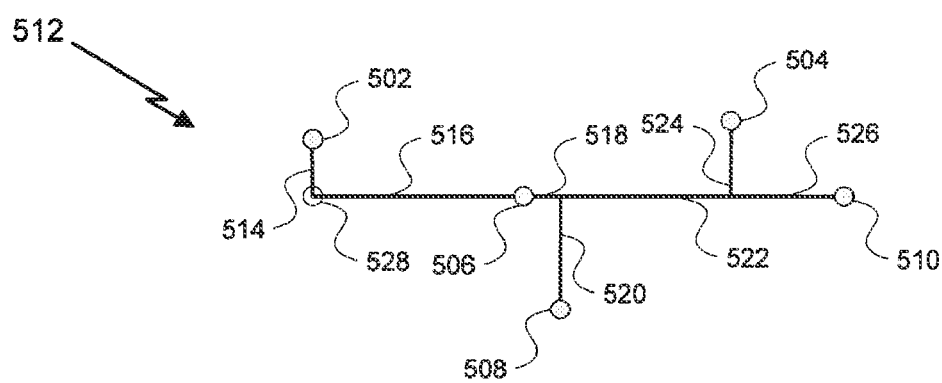
FIG. 5B illustrates an exemplary routed net coupling five pins.

FIG. 5A illustrates an exemplary collection 500 of five pins that may be coupled to form a routed net. As shown, pin collection 500 includes pins 502, 504, 506, 508, and 510. FIG. 5B illustrates an exemplary routed net 512 coupling pins 502, 504, 506, 508, and 510. As shown, routed net 512 comprises route segments 514, 516, 518, 520, 522, 524, and 526; each route segment begins or ends at a pin or an intersection with another route segment.

As shown in FIG. 5A, some pins are coupled to other pins via a combination of one horizontal route segment and one vertical route segment. Such a combination of route segments may be referred to as an L-path. For example, pin 502 and pin 506 are coupled by an L-path formed by route segment 514 and route segment 516. Other pins may be coupled by either one or more single horizontal route segments or one or more vertical route segments rather than a combination of horizontal and vertical route segments. For example, pin 506 and pin 510 are coupled by horizontal route segments 518, 522, and 526.

Collectively, route segments 514, 516, 518, 520, 522, 524, and 526 form what is known as a Steiner Tree. Although many different Steiner Tree configurations of varying routing efficiency are possible for coupling a collection of pins, a minimum-length Steiner Tree is desirable for estimating routing resource requirements.

Forming Minimum-length Steiner Trees

Figure 6:
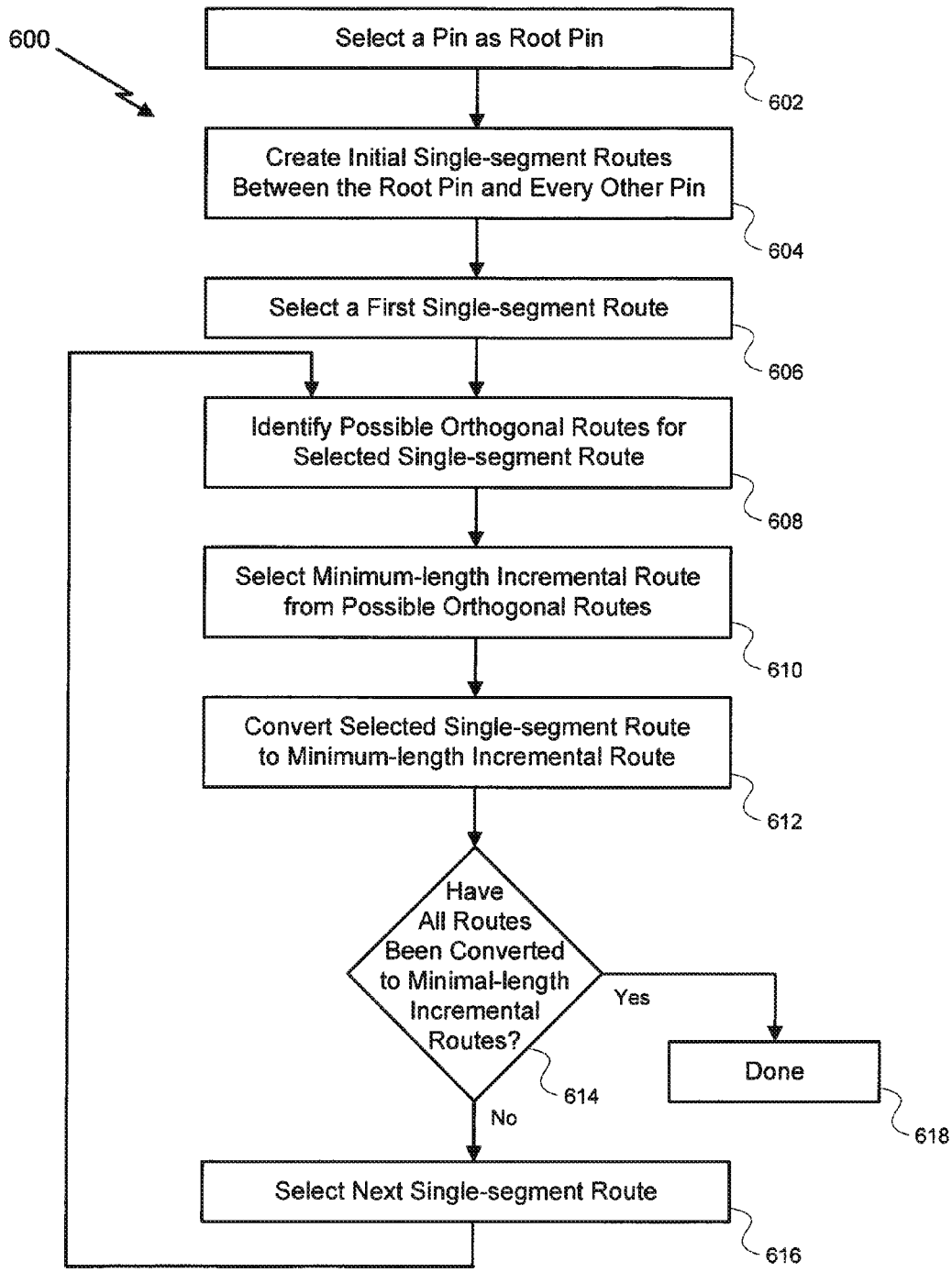
FIG. 6 illustrates an exemplary method for constructing a minimum-length Steiner Tree from a collection of pins.
Figure 7A:
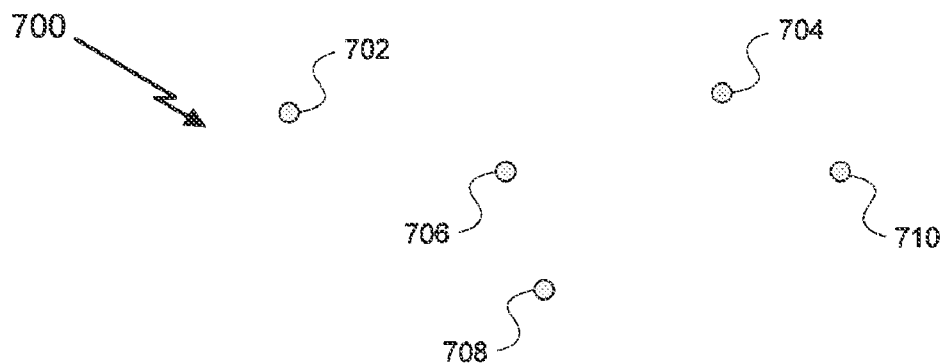
FIG. 7A illustrates a collection of pins.

FIG. 6 illustrates an exemplary method 600 for constructing a minimum-length Steiner Tree from a collection of pins. The concepts of method 600 will be discussed with reference to FIGS. 7A-7D, which illustrate an exemplary collection of pins 700 that may be coupled to form a minimum-length Steiner Tree using method 600. As shown in FIG. 7A, the collection of pins 700 comprises pins 702, 704, 706, 708, and 710.

Initially, a root pin is selected from among the collection of pins to be coupled to form a minimum-length Steiner Tree (step 602). In one embodiment, a pin is selected randomly from the collection of pins to be the root pin. In another embodiment, other methods for selecting a root pin from the collection of pins may be employed. Utilizing the example of FIG. 7A, pin 706 may be selected to be the root pin for the collection of pins 700.

Figure 7B:
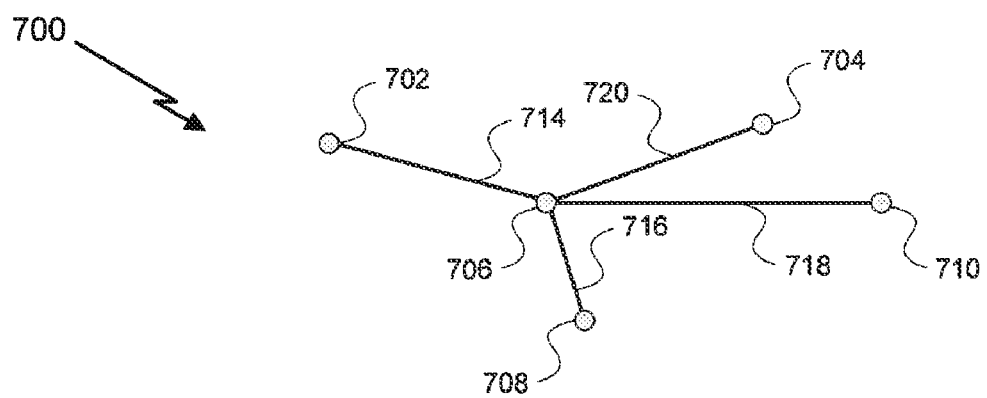
FIG. 7B illustrates an exemplary collection of pins with single segment, minimum length routes created between a root pin and every other pin.

Initial routes are then created between the root pin and every other pin within the collection of pins (step 604). These initial routes utilize single-segment, minimum-length routes. The concepts of step 604 may be illustrated by FIG. 7B, which shows the exemplary collection of pins 700 with single segment, minimum length routes created between root pin 706 and every other pin. As shown, FIG. 7B illustrates route 718 coupling pin 706 and pin 710, route 720 coupling pin 704 and pin 706, route 716 coupling pin 706 and pin 708, and route 714 coupling pin 702 and pin 706.

Next, a first single-segment, minimum-length route is selected for translation into an orthogonal, minimum-length route (step 606). An orthogonal, minimum-length route may be comprised of a two-segment L-path as well as a single-segment, horizontal or vertical route segment. In one embodiment, a first single-segment, minimum-length route is selected randomly from the collection of single-segment, minimum-length routes. In another embodiment, other methods for selecting a first single-segment, minimum-length route may be employed. Referring again to the example of FIG. 7B, route 718 may be selected as a first single-segment, minimum-length route for translation from among the single segment, minimum length routes 714, 716, 718, and 720.

Thereafter, possible orthogonal routes are identified for the single-segment, minimum-length route currently selected (step 608). Referring now to the example of FIG. 7C, route 718, which couples pin 706 and pin 710, may be an orthogonal route (i.e., composed entirely of a horizontal routing segment or a vertical routing segment or a combination of a horizontal routing segment and a vertical routing segment) without decomposing route 718 into a horizontal route segment and a vertical route segment. Alternatively, route 720, coupling pin 704 and pin 706, is not an orthogonal route prior to decomposing route 720 into a horizontal route segment and a vertical route segment.

Figure 7C:
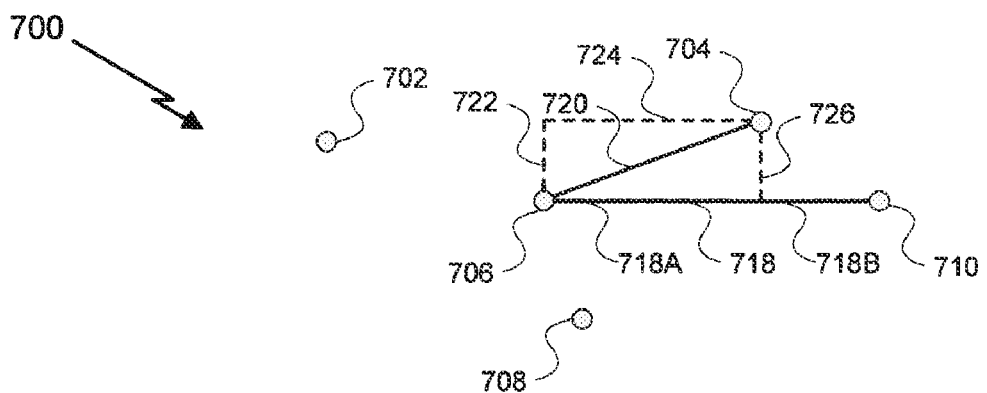
FIG. 7C illustrates a minimum length route and two orthogonal, minimum-length routing alternatives.

As further shown in FIG. 7C, exemplary route 720 may be decomposed into a plurality of potential orthogonal routes: a first orthogonal route comprising horizontal routing segment 724 and vertical routing segment 722 or a second orthogonal route comprising vertical routing segment 726 and a portion of horizontal routing segment 718, shown as routing segment 718A in FIG. 7C. As shown, routing segment 718 comprises routing segments 718A and 718B; routing segment 718A begins at pin 706 and ends at the intersection with routing segment 726 while routing segment 718B begins at the intersection with routing segment 726 and ends at pin 710.

Subsequently, a shortest incremental route is selected from the orthogonal routes identified in step 608 (step 610). This selection minimizes additional routing resources consumed by an orthogonal version of the route selected in step 606 relative to routing resources consumed by previously-selected orthogonal routes. Although several possible orthogonal routes may be selectable for each single-segment, minimum-length route, one or more of those orthogonal routes may also overlap previous orthogonal route selections. To the extent that an orthogonal route identified in step 608 overlaps a portion of a previously-selected, orthogonal route, only the non-overlapping portion of the possible orthogonal route would consume additional (i.e., incremental) routing resources if that orthogonal route were selected. Thus, routing efficiencies may be realized by selecting an orthogonal route that minimizes non-overlap between the selected orthogonal route and previously-selected orthogonal routes. The orthogonal route that minimizes non-overlap in this manner is referred to as the "Minimum-length Incremental Route," in step 610.

The concept of "Minimum-length Incremental Route" may be illustrated by FIG. 7C, which shows two possible orthogonal routes for single-segment, minimum-length route 720, as previously discussed. Assume for the present illustration that routing segment 718 (comprising routing segments 718A and 718B) is a previously-selected, orthogonal route. Since route segments 722, 724, 718A, and 726 form a rectangle, the length of route segment 722 equals the length of route segment 726 and the length of route segment 718A equals the length of route segment 724. Therefore, the length of the first orthogonal route (comprising route segments 722 and 724) equals the length of the second orthogonal route (comprising segments 718A and 726).

The portion of the second orthogonal route comprising route segment 718A, however, overlaps a portion of a previously-selected, orthogonal segment represented by segment 718. Therefore, only the non-overlapping portion of the second orthogonal route would consume incremental routing resources if the second orthogonal route were selected. Since neither routing segment 722 nor routing segment 724 overlap a previously selected orthogonal segment, both routing segments would consume incremental routing resources if the first orthogonal route were selected. Thus, the incremental length of the second orthogonal route is less than the incremental length of the first orthogonal route.

Next, the currently-selected, single-segment route is converted to the minimum-length, incremental route selected in step 610 (step 612). As discussed in conjunction with the previous illustration from FIG. 7C, if routing segment 720 was the current minimum-length, single-segment route selected and routing segment 726 was selected as the shortest incremental route for routing segment 720, routing segment 720 may be converted to routing segment 726. Additionally, since the first orthogonal route (comprising routing segments 722 and 724) was never selected, it may be removed from further consideration.

Figure 7D:
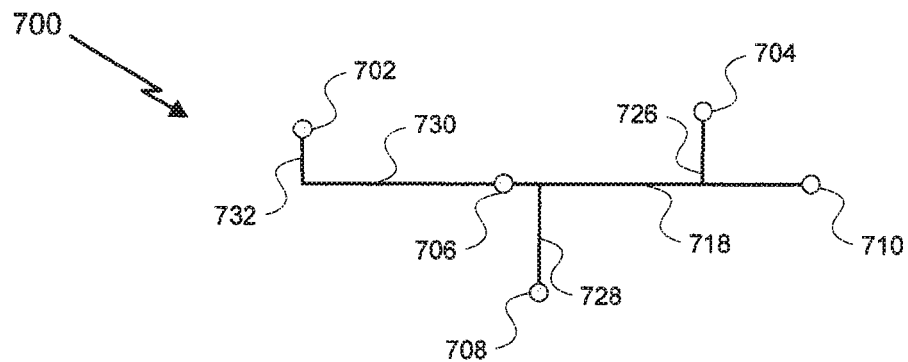
FIG. 7D illustrates an exemplary minimum-length Steiner Tree that may result from applying the method to the collection of pins.

Thereafter, a determination is made whether all of the single-segment, minimum-length routes have been converted to shortest incremental routes (step 614). If all single-segment, minimum-length routes have been converted to shortest incremental routes, the Steiner Tree is complete so the method terminates (step 618). Otherwise, the method selects a remaining single-segment, minimum-length route (step 616) prior to repeating steps 608-614. FIG. 7D illustrates an exemplary minimum-length Steiner Tree that may result from applying the method 600 to the collection of pins 700.

The preceding discussion describes a method for coupling a collection of pins using a minimum-length Steiner Tree structure to form a routed net. Some properties of the minimum-length Steiner Tree structure lend themselves to accurate predictions of routing resource needs. Therefore, the discussion that follows discusses a method for estimating routing segment length within minimum-length Steiner Trees.

H/V Demand Ratio for Nets with Two or Three Pins

The discussion that follows extends the discussion of forming minimum-length Steiner Trees to estimating the length, in horizontal and vertical dimensions, of segments within minimum length Steiner trees. This discussion begins by focusing on nets comprising two or three pins and then continuing to nets with an arbitrary number of pins. Across all routed nets, an aggregate estimate of horizontal and vertical routing segment length may be determined for a block. From that aggregate estimate, an accurate minimum height and minimum width for the block may be determined.

Discussion of estimated segment length begins with discussion of routed nets comprising two or three pins. Routed nets comprising two or three pins have a special property: lengths of these nets in the horizontal and vertical dimensions are equal to the width and height of a bounding box formed by the two or three pins, regardless of the position of those pins. This special property may simplify estimating segment length for routes coupling two and three pins, as discussed below.

Figure 8A:
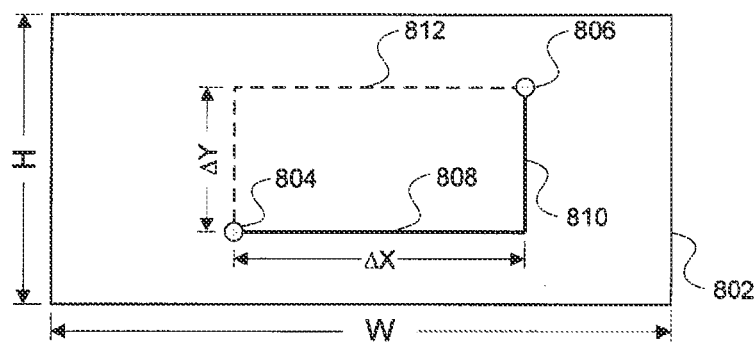
FIG. 8A illustrates an exemplary block comprising pins coupled by a routed net comprising route segments.

FIG. 8A illustrates an exemplary block 802 comprising pins 804 and 806 coupled by a routed net comprising route segments 808 and 810. Bounding box 812 may be formed from the coordinates of pins 804 and 806. As shown, the bounding box 812 overlaps route segments 808 and 810. The width and height of bounding box 812 is ΔX and ΔY, respectively. Although other routed segments of different lengths and locations could couple pins 804 and 806, those skilled in the art will recognize that the cumulative vertical and horizontal length of such segments would still match the width and height of bounding box 812 if the routed segments were efficiently selected.

Figure 8B:
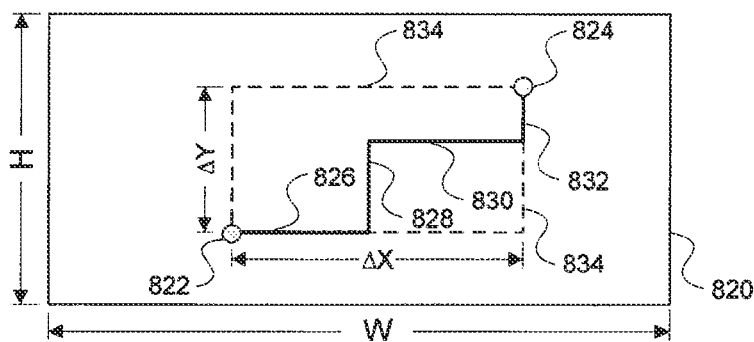
FIG. 8B illustrates another exemplary block comprising pins coupled by a routed net comprising route segments.

FIG. 8B illustrates another exemplary block 820 comprising pins 822 and 824 coupled by a routed net comprising route segments 826, 828, 830, and 832. Importantly, the coordinates of pins 822 and 824 match those of pins 804 and 806, respectively. Bounding box 834 may be formed from the coordinates of pins 822 and 824. As shown in FIG. 8B, the width and height of bounding box 834 is also ΔX and ΔY, respectively, even though the topology of the routed net in FIG. 8B differs from that in FIG. 8A. Thus, despite pins 804 and 806 being coupled through routing segments of different lengths and locations than those coupling pins 822 and 824, the cumulative vertical and horizontal length of the routing segments coupling both pairs of pins is identical (if the routed segments were efficiently selected).

Figure 8C:
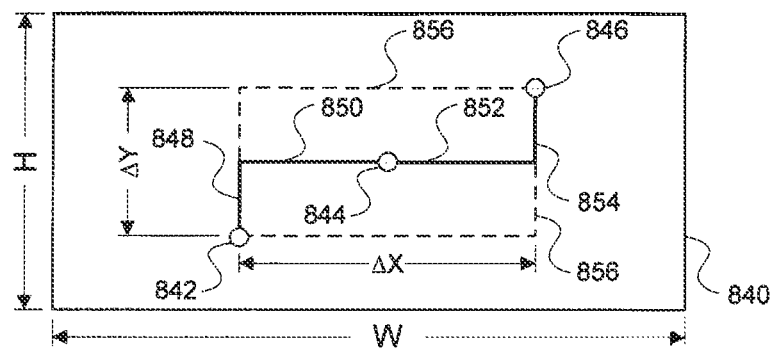
FIG. 8C illustrates yet-another exemplary block comprising pins coupled by a routed net comprising route segments.

Routed nets comprising three pins also exhibit the above-described property of routed nets comprising two pins. FIG. 8C illustrates an exemplary block 840 comprising pins 842, 844, and 846 coupled by a routed net comprising route segments 848, 850, 852, and 854. Bounding box 856 may be formed from the coordinates of pins 842 and 846. As shown in FIG. 8C, the width and height of bounding box 856 is ΔX and ΔY, respectively. Those skilled in the art will recognize that altering the position of pin 844 within bounding box 856 may change the length and position of individual routing segments 848, 850, 852, and 854 but would not change the cumulative length of horizontal and vertical route segments coupling the three pins (if the routed segments were efficiently selected). Thus, the cumulative vertical and horizontal length of routing segments coupling three pins is equal to the height and width of the bounding box formed by the three pins.

The discussion that follows describes a generalized determination of the estimated distance between pins along a one-dimensional routed net. This discussion extends the prior concepts of bounding boxes formed by two or three pins to estimate segment length involving an arbitrary number of pins.

Figure 9:
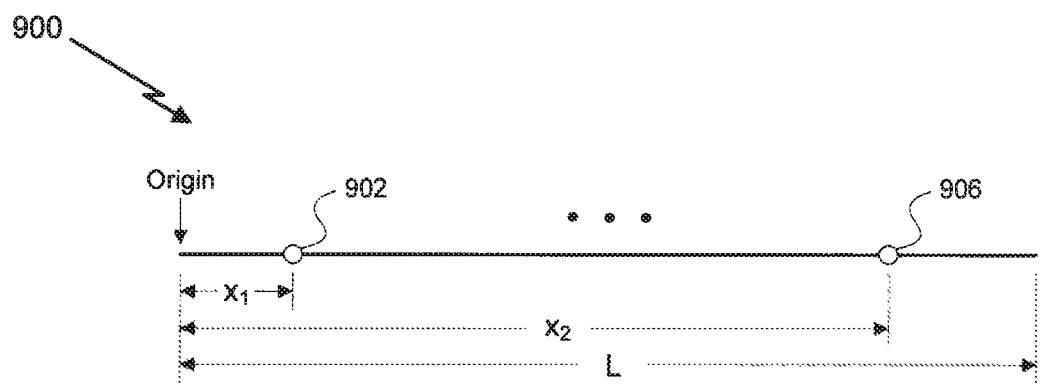
FIG. 9 illustrates an exemplary one-dimensional routed net of length L comprising a plurality of pins whose locations are randomly distributed between a minimum distance from the origin and a maximum distance from the origin.

FIG. 9 illustrates an exemplary one-dimensional routed net 900 of length L comprising a plurality of pins whose locations are randomly distributed between a minimum distance from the origin ($x_1$) and a maximum distance from the origin ($x_2$). As shown, pin 902 is the left-most pin along routed net 900 and is located at a distance of $x_1$ from the origin. Additionally, pin 906 is the right-most pin along routed net 900, and is located at a distance of $x_2$ from the origin. Routed net 900 may also comprise an arbitrary number of additional pins (not illustrated) located between positions $x_1$ and $x_2$, inclusive. Thus, for the above-described distribution of pins along routed net 900, the maximum distance between any two pins is shown by equation (3), below.

$$D_{x_1 x_2} = x_2 - x_1 \qquad (3)$$

Although final pin positions and actual routed net length within a block may not be known until placement and routing is complete, a probabilistic estimation of routed segment length may be made after synthesis is complete, based on design parameters that are known at that time. The known design parameters that allow for such a probabilistic estimation are the number of nets in the block and the number of pins within each net.

Those skilled in the art will recognize that equation (4), below, represents the likelihood that n pins distributed along a routed net of length L will all be located between positions $x_1$ and $x_2$, inclusive.

$$P_{x_1,x_2} = \left(\frac{D_{x_1,x_2}}{L}\right)^{(n-z)} \cdot \frac{n \cdot (n-1)}{L^2} \quad (4)$$

Multiplying equation (3) by equation (4) provides an important result—the product of distance (between any two points $x_1$ and $x_2$) and occurrence likelihood (for any given line of length L containing n points). Integrating the product of equation (3) and equation (4) for all values of $x_1$ and $x_2$, as shown in equation (5), provides an expected distance between $x_1$ and $x_2$, given a segment length L containing n points.

$$L_n = \int_{x_2=0}^{x_2=L} \int_{x_1=0}^{x_1=x_2} D_{x_1,x_2} \cdot P_{x_1,x_2} \quad (5)$$

Solving the double integral of equation (5) leads to equation (6).

$$L_n = \frac{(n-1) \cdot L}{(n+1)} \quad (6)$$

Equation (6) may be applied to determine a probabilistic estimate of the segment length for nets comprising two or three pins. Recall that nets comprising two or three pins have a special characteristic: their length and width equals the length and width of a bounding box formed by their points. Thus, equation (6) may be applied to estimate the minimum-length, orthogonal route between two or three points within a design block. For example, referring again to FIG. 8A, point 804 and point 806 are coupled by routing segment 808 and routing segment 810. Equation (6) allows an expected segment length for routing segment 808 ($\Delta X$) to be determined from the width of the block (W), which corresponds to L in equation (6), and the number of pins in the routed net (n). For the example of FIG. 8A, only two pins are present in the routed net. Thus, from equation (6), the expected horizontal segment length for nets comprising two pins (e.g., routed segment 808) is W/3. Similarly, the expected vertical segment length for nets comprising two pins (e.g., routed segment 810) is H/3.

From the expected horizontal and vertical segment lengths of a routed net, a generalized estimate of H/V Demand Ratio can be found: H/V Demand Ratio equals the expected horizontal segment length divided by the expected vertical segment length. Thus, for nets coupling two pins, based on expected segment length determinations, the H/V Demand Ratio is W/H.

A similar result may be determined for three-pin nets. Applying equation (6) to the pins and routing segments of FIG. 8C, we find that the expected horizontal segment length for three-pin routes is W/2 and the expected vertical segment length for three-pin routes is H/2. Thus, for three-pin nets, the H/V demand ratio is also W/H. The H/V demand ratio ($R_x$) for nets comprising two or three pins is summarized in equation (7).

$$R_2 = R_3 = W/H \quad (7)$$

H/V Demand Ratio for Nets with More than Three Pins

The above-described determination of H/V demand ratio for nets comprising two or three pins may be extended to determine the H/V Demand Ratio for nets comprising more than three pins. This extension involves several steps. First, a bounding box is formed, representing the smallest bounding box containing all pins coupled to form the routed net. Second, a root pin is selected for the routed net and the root pin is coupled to the pins forming the bounding box. Third, the bounding box is partitioned into regions for determining minimum-length, orthogonal routes from a particular pin to the root pin. Fourth, a probability of a pin falling within those regions is determined. Fifth, an expected length for a pin falling within those regions is determined. Finally, an H/V Demand Ratio for a net comprising more than three pins is determined from a combination of the preceding determinations. Each of these steps is described in the discussion that follows.

Figure 10A:
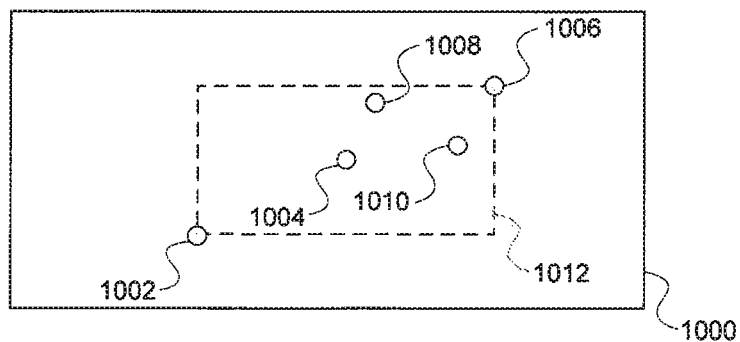
FIG. 10A illustrates an exemplary block containing a net comprising more than three pins.

FIG. 10A illustrates an exemplary block 1000 containing a net comprising more than three pins. As shown, block 1000 comprises pin 1002, pin 1004, pin 1006, pin 1008, and pin 1010; all five pins correspond to a single net and will be coupled via routing to form a single net in a subsequent step. Pin 1002 and pin 1006 form a bounding box 1012; these pins were selected to form the bounding box 1012 because the bounding box formed by these pins is the smallest bounding box that will contain all pins corresponding to the single net within block 1000.

Figure 10B:
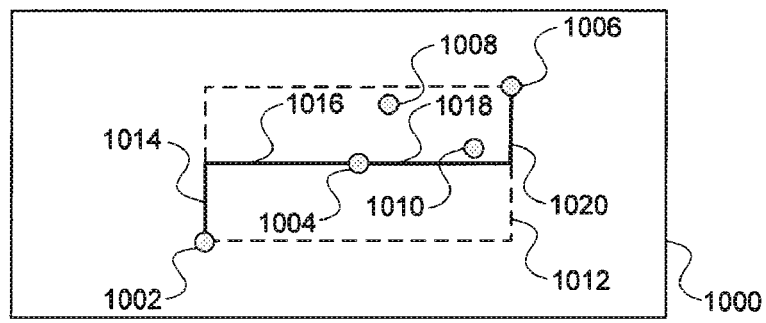
FIG. 10B illustrates an exemplary block with a root pin coupled to the pins that form the bounding box.

Next, a root pin is selected and coupled to the pins forming the bounding box. The root pin is chosen to be at or near the center of the bounding box because centering the root pin within the bounding box will simplify the determinations that follow. FIG. 10B illustrates an exemplary block 1000 with a root pin 1004 coupled to the pins 1002 and 1006 that form the bounding box 1012. As shown, pin 1004 is selected as a root pin because pin 1004 is at or near the center of the bounding box 1012. Routing segments 1014, 1016, 1018, and 1020 couple pins 1002, 1004, and 1006. The expected length of routing segments 1014, 1016, 1018, and 1020 may be determined from the prior discussion of expected segment length for nets containing two and three pins, as discussed in conjunction with FIG. 9.

Coupling pins 1008 and 1010 to routing segments 1014, 1016, 1018, or 1020 involves constructing minimum-length incremental (orthogonal) routes for each pin, as discussed in conjunction with FIGS. 7A-7D. Estimating the lengths of such minimum-length incremental routes involves partitioning the bounding box into regions and determining an expected routing length for pins in each region.

Figure 10C:
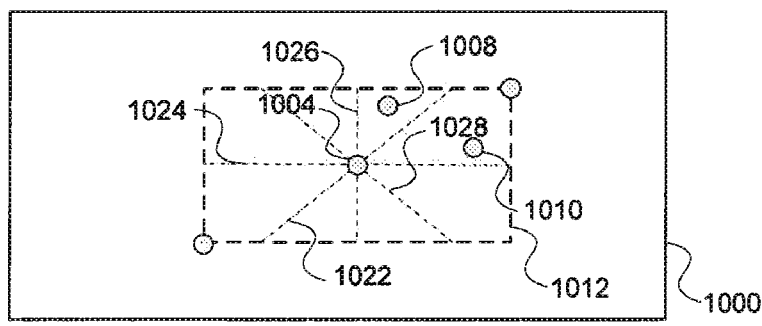
FIG. 10C illustrates an exemplary block whose bounding box has been partitioned into regions.

FIG. 10C illustrates an exemplary block 1000 whose bounding box 1012 has been partitioned into regions. These regions are created by extending four partition lines through the root pin. One partition line is horizontal, one partition line is vertical, a third partition line is at a forty-five degree angle from horizontal, and a fourth partition line is at a one hundred and thirty-five degree angle from horizontal. As shown, partition line 1024 represents the horizontal partition line, partition line 1026 represents the vertical partition line, partition line 1022 represents the partition line at a forty-five degree angle, and partition line 1028 represents the partition line at a one hundred and third-five degree angle.

Figure 10D:
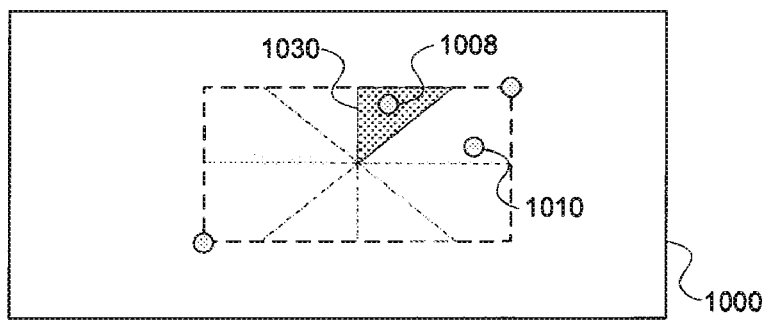
FIG. 10D illustrates an exemplary partition within a block.

FIG. 10D illustrates an exemplary partition 1030 within a block 1000. The partition lines described in conjunction with FIG. 10B are also present in FIG. 10C, although labels for partition lines 1022, 1024, 1026, and 1028 have been omitted from FIG. 10D for clarity. Partition 1030 represents one region where minimum-length, orthogonal routes may be formed by creating a routing segment from a pin within partition 1030 to the vertical partition line 1026. The significance of the partition line 1022 (at forty-five degrees above horizontal) is that any point above that line (e.g., any point within partition 1030) is located closer to the vertical partition line 1026 than to the horizontal partition line 1024. Thus, a minimum-length incremental (orthogonal) route from a pin within partition 1030 preferentially involves a horizontal route to the vertical partition line 1026 rather than a vertical route to the horizontal partition line 1024.

Figure 10E:
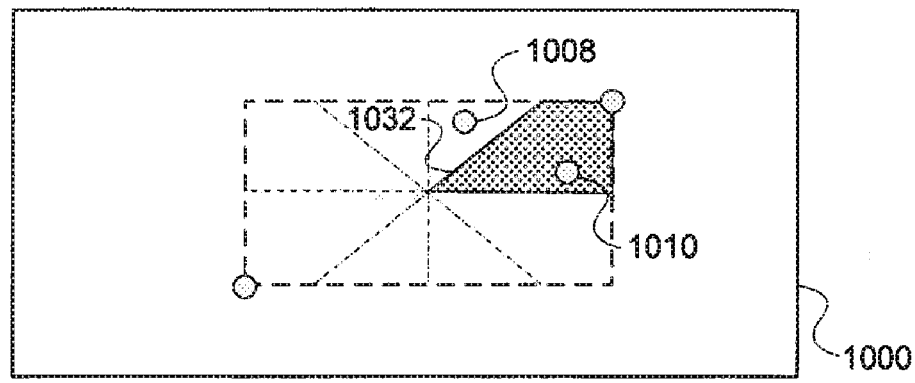
FIG. 10E illustrates another exemplary partition within a block.

FIG. 10E illustrates an exemplary partition 1032 within a block 1000. Partition 1030 represents one region where minimum-length incremental (orthogonal) routes may be formed by creating a routing segment from a pin within partition 1032 to the horizontal partition line 1024. Since any point within partition 1032 is located closer to the horizontal partition line than the vertical partition line, a minimum-length incremental (orthogonal) route from a pin within partition 1032 preferentially involves a vertical route to the horizontal partition line 1024.

The probability of pins falling within partitions 1030 and 1032 may be determined by extending the determination discussed in conjunction with FIGS. 8A, 8B, and 9 to encompass pin locations that vary in two dimensions (i.e., from the root pin to a pin within partition 1030 or within partition 1032) rather than merely varying in one dimension. Although the discussion above focuses on the upper-left quadrant created by subdivision of bounding box 1012 by horizontal line 1024 and vertical line 1026, those skilled in the art will recognize that inherent symmetry in this subdivision readily allows for extending the discussion above to the other three quadrants formed by that subdivision of bounding box 1012.

Figure 11:
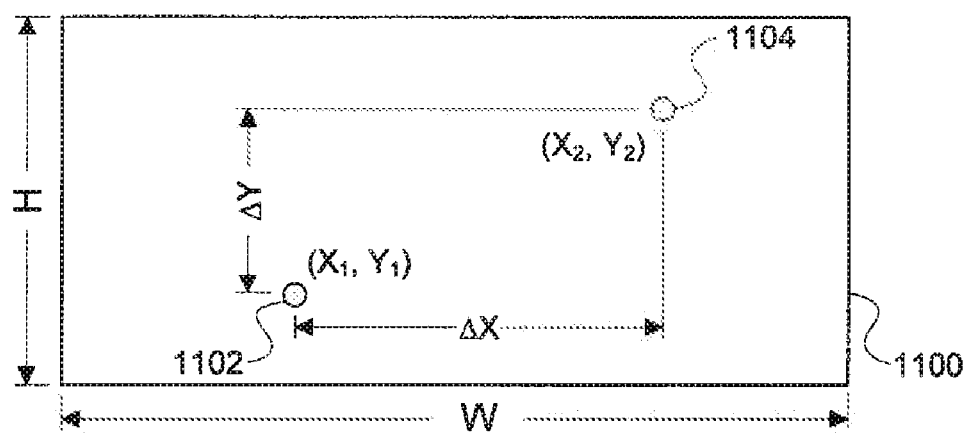
FIG. 11 illustrates a block containing an exemplary pair of pins whose pin locations vary in two dimensions.

FIG. 11 illustrates a block 1100 containing an exemplary pair of pins whose pin locations vary in two dimensions. As shown, block 1100 contains pins 1102 and 1104. Pin 1102 has coordinates $(X_1, Y_1)$ and pin 1104 has coordinates $(X_2, Y_2)$. For conceptual simplicity, pin 1102 may be considered a root pin, such as pin 1004 shown in FIG. 10B, and pin 1104 may be considered to be on or above a horizontal partition line as well as on or to the right of a vertical partition line (i.e., pin 1104 is located in either partition 1028 or 1030, as shown in FIGS. 10D and 10E). If pin 1104 lies above a partition line at forty-five degrees above horizontal, the value of $\Delta Y$ is greater than the value of $\Delta X$. Otherwise, the value of $\Delta Y$ is less than or equal to the value of $\Delta X$.

The discussion that follows assumes that the width of the block being considered is greater than the height of that block, consistent with the aspect ratio of the block being greater than one, as stated at the beginning of this discussion. Those skilled in the art will recognize that equations (8) and (9), below, represent the probability that a pin will be present in partition 1028 for values of $X_2$ greater than H.

$$P_{\Delta Y>\Delta X}^{x_2>H} = \int_{x_2=H}^{x_2=W}\int_{x_1=x_2-H}^{x_1=x_2}\int_{y_2=x_2-x_1}^{y_2=H}\int_{y_1=0}^{y_1=y_2-(x_2-x_1)} 4\cdot\left(\frac{1}{H}\right)^2\cdot\left(\frac{1}{W}\right)^2 \quad (8)$$

$$P_{\Delta Y>\Delta X}^{x_2>H} = \frac{2\cdot(H^3\cdot W - H^4)}{3\cdot H^2\cdot W^2} \quad (9)$$

Those skilled in the art will also recognize that equations (10) and (11), below, represent the probability that a pin will be present in partition 1028 for values of $X_2$ less than H.

$$P_{\Delta Y>\Delta X}^{x_2>H} = \int_{x_2=0}^{x_2=H}\int_{x_1=0}^{x_1=x_2}\int_{y_2=x_2-x_1}^{y_2=H}\int_{y_1=0}^{y_1=y_2-(x_2-x_1)} 4\cdot\left(\frac{1}{H}\right)^2\cdot\left(\frac{1}{W}\right)^2 \quad (10)$$

$$P_{\Delta Y>\Delta X}^{x_2<H} = \frac{H^2}{2\cdot W^2} \quad (11)$$

Equations (9) and (11) may be combined to determine the probability that a pin will be present in partition 1028 for all values of $X_2$, as shown in equation (12).

$$P_{\Delta Y>\Delta X} = P_{\Delta Y>\Delta X}^{x_2>H} + P_{\Delta Y>\Delta X}^{x_2<H} = \frac{2\cdot(H^3\cdot W - H^4)}{3\cdot H^2\cdot W^2} + \frac{H^2}{2\cdot W^2} \quad (12)$$

Equation (12) may also form the basis for determining the probability that a point will be present in partition 1030, rather than in partition 1028, as shown in equation (13).

$$P_{\Delta Y<\Delta X} = 1 - P_{\Delta Y>\Delta X} \quad (13)$$

Once a formula for the probability that pins will lie within partition 1030 or 1032 has been determined, a formula for the expected length of minimum-length, incremental (orthogonal) segments from a pin to a vertical or horizontal partition line, respectively, may be determined. Those skilled in the art will recognize that equations (14) and (15), below, represent the expected length of a minimum-length, incremental (orthogonal) segment from a pin to a horizontal or vertical partition line, respectively.

$$L_{\Delta Y<\Delta X}^{\Delta Y} = \frac{(1/48)\cdot H^3 + (1/16)\cdot H\cdot(W-H)^2}{(1/8)\cdot H^2 + (1/4)\cdot(W-H)^2} \quad (14)$$

$$L_{\Delta Y>\Delta X}^{\Delta X} = \frac{H}{6} \quad (15)$$

Those skilled in the art will also recognize that the expressions in equations (6), (12), (13), (14), and (15) may be combined to form an expression for H/V Demand Ratio of nets comprising more than three pins, as shown below in equation (16).

$$R_{n>3} = \frac{\frac{(n-1)\cdot W}{(n+1)} + (n-3)\cdot P_{\Delta Y>\Delta X}\cdot L_{\Delta Y>\Delta X}^{\Delta X}}{\frac{(n-1)\cdot H}{(n+1)} + (n-3)\cdot P_{\Delta Y<\Delta X}\cdot L_{\Delta Y<\Delta X}^{\Delta Y}} \quad (16)$$

H/V Demand Ratio for an Entire Block

An H/V Demand Ratio for an entire block may be determined by creating a weighted sum of H/V demand ratios for all numbers of pins, where the H/V demand ratio for each number of pins is determined as discussed in the preceding sections and the weighting factor for each H/V demand ratio is known. This determination was discussed in conjunction with equations (1) and (2), above, and is repeated below for convenience as equations (17) and (18).

$$R_h = \sum_{n=2}^{\infty} W_n \cdot \frac{R_n}{1+R_n} \quad (17)$$

$$R_{\frac{h}{v}} = \frac{R_h}{1-R_h} \quad (18)$$

For equation (17) to be applied, a weighting factor for each number of pins is needed ($W_n$). This weighting factor represents the ratio between the total wirelength for nets comprising a particular number of pins to the total wirelength for the block as a whole.

One method for determining $W_n$ (for each value of n) is to analyze real designs; within a completed design, total wirelength for each routed net as well as the number of pins that net comprises are readily ascertainable by those skilled in the art. Alternatively, methods for estimating overall wirelength (but not distinguishing horizontal versus vertical wirelength) have been published. See Shankar Balachandran and Dinesh Bhatia, *A-Priori Wirelength and Interconnect Estimation Based on Circuit Characteristics*, SLIP, 77-84 (2003) and Bahareh Fathi, Laleh Behjat, and Logan M. Rakai, *A Pre-placement Net Length Estimation Technique for Mixed-size Circuits*, SLIP, 45-52 (2009). Once $W_n$ has been determined for all relevant values of n, an H/V Demand Ratio for the entire design may be determined from equations (17) and (18).

Although equation (18) accurately estimates the H/V Demand Ratio for an entire block, the accuracy of that estimate may be improved by adding a coefficient that matches estimates to experimental results. This matching to experimental results is illustrated as equations (19) and (20). As shown, equation (19) incorporates a coefficient (S) raised to a logarithmic power of the aspect ratio for the block.

$$R_h = S^{\log AR} \sum_{n=2}^{\infty} W_n \cdot \frac{R_n}{1+R_n} \quad (19)$$

$$R_{\frac{h}{v}} = \frac{R_h}{1-R_h} \quad (20)$$

Experimental results suggest that using a value of 0.85 for S correlates results seen in actual designs to within 5% of estimates produced by equations (19) and (20).

Determining Wire Length in Horizontal and Vertical Directions

Once an H/V Demand Ratio for a block has been determined, an estimate of total wirelength in each of the horizontal and vertical routing layers needed to route a block may be determined. These estimates combine equations (19) and (20) with an estimate of the total wirelength for the block (T) to form a minimum wirelength needed for horizontal routing layers ($S_h$) and a minimum wirelength needed for vertical routing layers ($S_v$), as shown below.

$$S_h = T \cdot \frac{R_{h/v}}{1+R_{h/v}} \quad (21)$$

$$S_v = T \cdot \frac{1}{1+R_{h/v}} \quad (22)$$

Determining Wire Length Needed Per Routing Layer

Once the wirelength for the horizontal and vertical routing layers has been determined, those skilled in the art will readily recognize that the wire length needed for each horizontal ($L_h$) and vertical ($L_v$) layer may be readily determined from $N_h$ and $N_v$, the number of routing layers available to route horizontal and vertical wires, respectively.

$$L_h = S_h/N_h \quad (23)$$

$$L_v = S_v/N_v \quad (24)$$

The number of routing layers available to route horizontal and vertical wires may be determined by technology considerations, cost considerations, and also aspect ratio considerations. Technology considerations influence the number of routing layers that are available for use in a particular generation of IC manufacturing technology. As the number of routing layers increases, issues with materials science and etching can lead to reliability problems in manufactured ICs or to the need for additional processing steps during manufacturing to avoid such reliability problems. Thus, the number of routing layers that could be included in an IC tends to be limited in part by technology issues.

Cost considerations also weigh heavily in the decision on how many routing layers to use in an IC. Primarily, each additional routing layer leads to several additional processing steps during manufacturing for depositing a metal layer, patterning etch of the metal layer, etching the metal layer, and insulating the etched metal layer from other metal layers. In addition, as discussed above, even more processing steps may be required to allow the metal layer to be reliably manufactured from a materials science and etching perspective. Each additional processing step increases the cost of manufacturing the IC, so cost considerations also weigh heavily on the decision on how many routing layers to use in an IC.

Aspect ratio considerations may also heavily affect the number of routing layers to use in an IC. Blocks with large aspect ratios (e.g., aspect ratios greater than two) are prone to regions of wiring resource shortage, which can lead to an inability to route through an area. As discussed previously, placement of many cells within a small area, such as cell group 316 in FIG. 3A, can lead to shortage of routing resources for global routing in that small area. One solution to such a routing resource shortage may be to add one or more additional metal layers with a wiring channel oriented in the direction of the wiring resource shortage (e.g., in the horizontal direction in the example of FIG. 3A). However, the routability benefits of adding one or more metal layers should be considered in light of the cost and reliability issues discussed above. Thus, efficient use of existing metal layers may be preferable to adding one or more routing layers to relieve routing congestion.

Determining Width and Height of a Block

From the wire length needed for each horizontal and vertical routing layer ($L_h$ and $L_v$), the minimum width ($W_{block}$) and minimum height ($H_{block}$) of the block may be determined. Those skilled in the art will recognize that the area consumed by wiring in the horizontal ($A_h$) and vertical ($A_v$) directions may be determined from the product of the length of wires in a horizontal and vertical layer ($L_h$ and $L_v$) and the width of each wiring track (e.g., the distance W illustrated in FIG. 4A) in each respective routing layer ($s_h$ and $s_v$), as shown below.

$$A_h = L_h \cdot s_h \quad (25)$$

$$A_v = L_v \cdot s_v \quad (26)$$

Additionally, a minimum block area ($Block_{min\ area}$) is the larger of the area consumed per layer for routing in the horizontal direction ($A_h$) or the area consumed per layer for routing in the vertical direction ($A_v$), as shown below.

$$Block_{min\ area} = MAX(A_h, A_v) \quad (27)$$

Further, those skilled in the art will readily recognize that the width of the block ($W_{block}$) and the height of the block ($H_{block}$) can be determined from the area of the block ($Block_{min\ area}$) and the aspect ratio of the block (AR), as shown below.

$$W_{block} = Block_{min\ area}/H_{block} \tag{28}$$

$$W_{block} = AR \cdot H_{block} \tag{29}$$

$$W_{block}^2 = (Block_{min\ area}/H_{block}) \cdot (AR \cdot H_{block}) \tag{30}$$

$$W_{block} = \sqrt{Block_{minarea} \cdot AR} \tag{31}$$

$$H_{block} = W_{block}/AR \tag{32}$$

Now that the block width and block height have been determined, an additional optimization is available for maximizing the usability of the metal-1 routing layer.

Metal-1 Layer as a Useful Routing Resource

As previously discussed, prior to the present invention, the first metal layer [i.e., metal-1] was typically reserved for standard cells while other metal layers [e.g., metal-2, metal-3, etc.] were typically reserved for routing. This prior approach, however, led to inefficient use of the metal-1 layer and thus greater reliance on the other metal layers for routing. Greater reliance on other metal layers generally leads to larger block sizes, which further leads to greater manufacturing costs and lesser product competitiveness (as discussed above).

One solution to inefficient use of the metal-1 layer is to reserve wiring channels for routing in that metal layer. These wiring channels may be reserved for routing by ensuring that cells identified by synthesis get placed outside the reserved routing channels. Accordingly, the reserved routing channels are available for routing.

Figure 12:
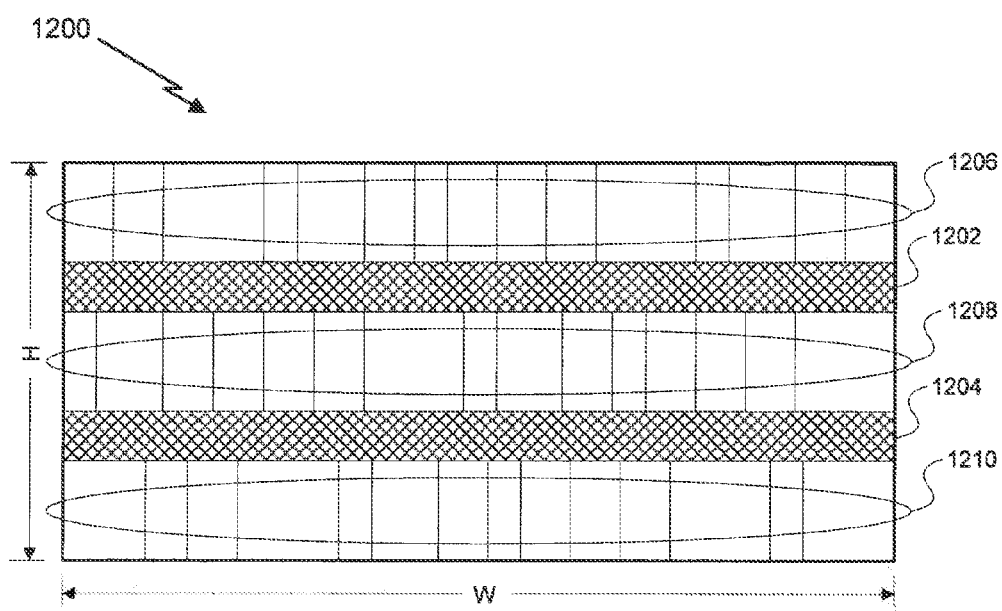
FIG. 12 illustrates a block that was placed and routed with global routing channels reserved in metal-1.

FIG. 12 illustrates a block 1200 that was placed with routing channels reserved in metal-1. As shown, the block 1200 comprises a first routing channel 1202 and a second routing channel 1204. Additionally, the block 1200 comprises a first row of cells 1206, a second row of cells 1208, and a third row of cells 1210. The cell placement illustrated in FIG. 12 (i.e., three rows of cells and two routing channels) may be accomplished by reserving the portion of block 1200 represented by the routing channels 1202 and 1204 so that the placement tool places cells outside the routing channels. This discussion that follows sets forth the steps for determining the size of the routing channels in metal-1 and for determining whether the routing channels in metal-1 should be oriented vertically or horizontally.

Figure 13:
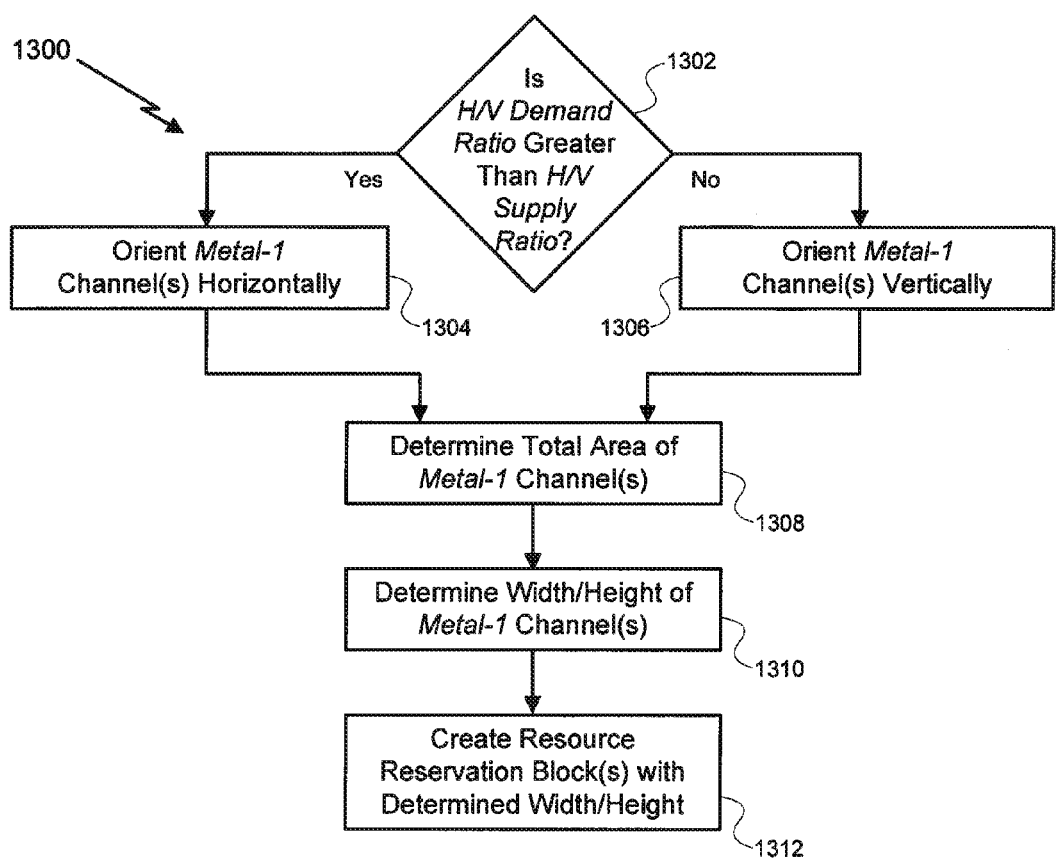
FIG. 13 illustrates an exemplary method for utilizing metal-1 as a useful routing resource.

FIG. 13 illustrates an exemplary method 1300 for utilizing metal-1 as a useful routing resource. Initially, the H/V Demand Ratio for the block, previously determined as discussed above, is compared to the H/V Supply Ratio (step 1302). The H/V Supply Ratio represents the ratio between the minimum wirelength needed for horizontal routing layers ($S_h$), as discussed in conjunction with equation (21), and the minimum wirelength needed for vertical routing layers ($S_v$), as discussed in conjunction with equation (22).

If the H/V Demand Ratio is greater than the H/V Supply Ratio, thereby indicating that additional wiring resources would be more beneficial in the horizontal direction than in the vertical direction, the metal-1 routing channels are chosen to be oriented in the horizontal direction (step 1304) and the method continues to step 1308. Alternatively, if the H/V Demand Ratio is less than the H/V Supply Ratio, thereby indicating that additional wiring resources would be more beneficial in the vertical direction than in the horizontal direction, the metal-1 routing channels are chosen to be oriented in the vertical direction (step 1306) and the method continues to step 1308.

Thereafter, the area for the metal-1 routing channels is determined (step 1308). This area may be determined by multiplying the total area of the design (i.e., the product of the block width and the block height) by a utilization ratio and subtracting the total cell area for the design. The utilization ratio represents the efficiency that cells are placed within the design. Some placement tools realize 95% utilization of available silicon area, so in one embodiment a utilization ratio of 0.95 is appropriate. In other embodiments using other placement tools, other utilization ratios may be appropriate. The total cell area for the design represents a summation of weighted silicon area values for each cell selected for placement by the synthesis tool. For example, if a design is composed of instances of a first cell and a second cell, and the first cell has an area of W and the second cell has an area of X, but the first cell is placed Y times in the design and the second cell is placed Z times, the total cell area for the design equals W*Y+X*Z. Since the area for each cell (e.g., W and X) is readily determinable from the dimensions of the cell as stored in the cell library, and the number of instantiations of each cell in the design is known from the synthesis result, the total cell area is readily ascertainable as described above.

From the total area of the metal-1 routing channels, the undetermined dimension for each routing channel may be determined next (step 1310). For routing channels in the horizontal direction, the width of the routing channel is fixed by the width of the block; the undetermined dimension is equal to the total area of the metal-1 routing channels (as determined in step 1308) divided by the width of the block and the number of metal-1 routing channels to implement. Alternatively, for routing channels in the vertical direction, the height of the routing channel is fixed by the height of the block; the undetermined dimension is equal to the total area of the metal-1 routing channels (as determined in step 1308) divided by the height of the block and the number of metal-1 routing channels to implement. In one embodiment, metal-1 routing channels are placed between each row of cells, as illustrated in FIG. 12 (i.e., the number of metal-1 routing channels is one less than the number of cell rows). In other embodiments, however, the number of metal-1 routing channels relative to cell rows may vary.

Once the height of the metal-1 routing channels has been determined, method 1300 concludes with resource reservation creation and placement for each metal-1 routing channel within the block (step 1312). By creating and placing a resource reservation over the region within the block that metal-1 routing channels are desired, the cell placement tool will be prevented from placing cells within that area, thereby saving that area for routing when the routing tool is run on the block.

Figure 14:
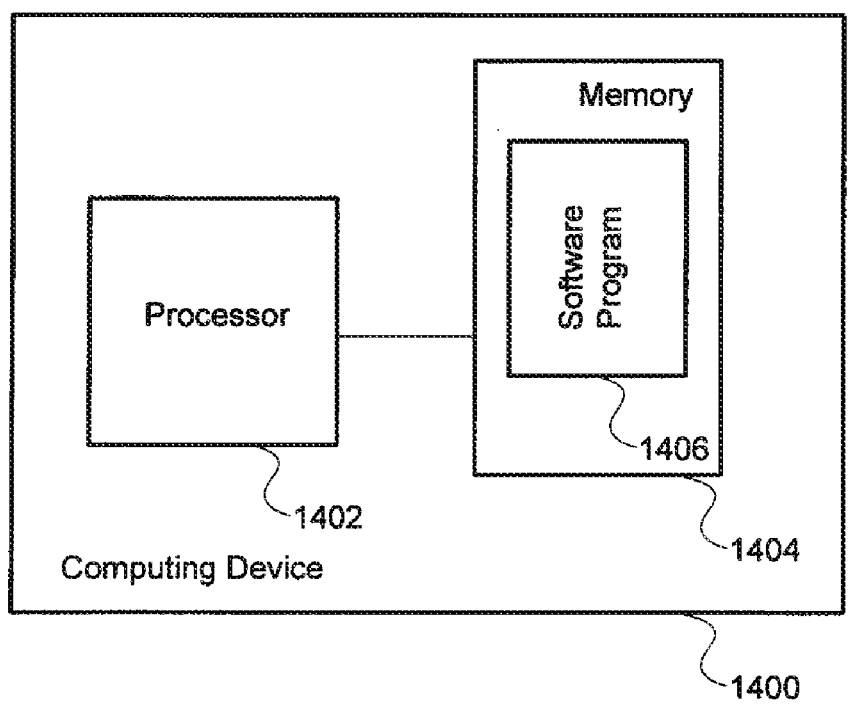
FIG. 14 illustrates a system comprising a computing device capable of performing the exemplary method.

FIG. 14 illustrates a system comprising a computing device 1400 capable of performing the exemplary method. As shown, the computing device 1400 comprises a processor 1402 and a memory 1404. As further illustrated in FIG. 14, the memory 1404 stores a software program 1406. The software program 1406 may be executed by the processor 1402, thereby performing the previously-discussed process steps.

The foregoing discussion sets forth a method and system for designing and making a block within an integrated circuit, such that the integrated circuit may be designed and manufactured with fast time-to-market and low manufacturing cost. Although the method and system has been described in the context of a series of embodiments, those skilled in the art will readily recognize that the method admits of other embodiments without departing from the scope of the method and system.

The invention claimed is:

1. A method for designing an integrated circuit (IC), the method comprising:
    identifying, by a computer, an initial aspect ratio for a block that implements the IC, the initial aspect ratio being reflective of a ratio of a dimension of the block along a first direction and along a second direction;
    evaluating, by the computer, a demand ratio for the block, the demand ratio being reflective of a ratio of a conductive wiring demand along the first direction and a conductive wiring demand along the second direction;
    evaluating, by the computer, first-direction and second-direction routing resources needed for routing the circuitry in the block based at least on the demand ratio for the block;
    determining, by the computer, an area needed for an available routing layer based at least on the routing resources; and
    deriving, by the computer, desired dimensions for the block along at least one of the first direction and the second direction based at least on the area needed.

2. The method according to claim 1, wherein the first direction is a substantially horizontal direction and the second direction is a substantially vertical direction based on a top view of the block.

3. The method according to claim 1, wherein the demand ratio is the ratio of the conductive wiring demand along the first direction and the conductive wiring demand along the second direction for at least two layers of conductive wirings for the block.

4. The method according to claim 1, wherein deriving the desired dimension for the block comprises deriving a minimum dimension along the first direction and along the second direction.

5. A system comprising a computing device, which includes:
    one or more processors;
    a memory; and
    one or more programs, wherein the one or more programs are stored in the memory and configured to be executed by the one or more processors, the one or more programs comprising instructions that upon execution:
    identify an initial aspect ratio for a block that implements an integrated circuit (IC), the initial aspect ratio being reflective of a ratio of a dimension of the block along a first direction and along a second direction;
    evaluate a demand ratio for the block, the demand ratio being reflective of a ratio of a conductive wiring demand along the first direction and a conductive wiring demand along the second direction;
    evaluate first-direction and second-direction routing resources needed for routing circuitry in the block based at least on the demand ratio for the block;
    determine a number of wires needed for an available routing layer based at least on the routing resources; and
    derive desired dimensions for the block along at least one of the first direction and the second direction based at least on the number of wires needed.

6. The system according to claim 5, wherein the program further comprises instructions that upon execution derive a suggested size of the block based at least on the desired dimensions for the block along at least one of the first direction and the second direction and the initial aspect ratio for the block.

7. The system according to claim 5, wherein the first direction is a substantially horizontal direction and the second direction is a substantially vertical direction based on a top view of the block.

8. The system according to claim 5, wherein the demand ratio is the ratio of the conductive wiring demand along the first direction and the conductive wiring demand along the second direction for at least two layers of conductive wiring for the block.

9. The system according to claim 5, wherein determining the number of wires needed for an available routing layer comprises determining the number of wires needed for each available routing layer of at least two layers of conductive wirings for the block.

10. The system according to claim 5, wherein deriving the desired dimension for the block comprises deriving a minimum dimension along the first direction and along the second direction.

11. A method for designing an integrated circuit (IC), the method comprising:
    identifying, by a computer, an initial aspect ratio for a block that implements the IC, the initial aspect ratio being reflective of a ratio of a dimension of the block along a first direction and along a second direction;
    evaluating, by the computer, first-direction and second-direction routing resources needed for routing the circuitry based on the initial aspect ratio;
    determining, by the computer, an area needed for an available routing layer based at least on the routing resources; and
    deriving, by the computer, desired dimensions for the block along at least one of the first direction and the second direction based at least on the area needed.

12. A system comprising a computing device, which includes one or more processors;
    a memory; and
    one or more programs, wherein the one or more programs are stored in the memory and configured to be executed by the one or more processors, the one or more programs comprising instructions that upon execution:
    identify an initial aspect ratio for a block that implements an integrated circuit (IC), the initial aspect ratio being reflective of a ratio of a dimension of the block along a first direction and along a second direction;
    evaluate first-direction and second-direction routing resources needed for routing the circuitry based on the initial aspect ratio;
    determine an area needed for an available routing layer based at least on the routing resources; and
    derive desired dimensions for the layout along at least one of the first direction and the second direction based at least on the area needed.

* * * * *